United States Patent [19]
Trofimenkoff et al.

[11] Patent Number: 4,827,261
[45] Date of Patent: May 2, 1989

[54] CLOCK-CONTROLLED PULSE WIDTH MODULATOR

[76] Inventors: Frederick N. Trofimenkoff, #20 Varcourt Place N.W., Calgary, Alberta, Canada, T3A 0G8; Daniel J. Paslawski, 2435 Fourth Avenue, N.W., Calgary, Alberta, Canada, T2N 0P3; Chun O. Li, 64 Edgeburn Crescent, N.W., Calgary, Alberta, Canada, T3A 3E6

[21] Appl. No.: 117,213

[22] Filed: Nov. 4, 1987

[51] Int. Cl.$^4$ .............................................. H03M 1/60
[52] U.S. Cl. ..................................... 341/157; 341/167
[58] Field of Search ............... 307/261, 269; 328/127, 328/151; 340/347 AD, 347 NT; 341/128, 157, 167

[56] References Cited
U.S. PATENT DOCUMENTS

| | | | |
|---|---|---|---|
| 3,660,834 | 5/1972 | Picot et al. | 340/347 NT |
| 3,970,943 | 7/1976 | Chapman et al. | 328/151 |
| 4,118,696 | 10/1978 | Warther | 340/347 NT |
| 4,410,812 | 10/1983 | Hönig et al. | 328/151 |
| 4,446,439 | 5/1984 | Mizumoto et al. | |
| 4,558,301 | 12/1985 | Trofimenkoff et al. | |
| 4,584,566 | 4/1986 | Arcara | 340/347 NT |
| 4,623,800 | 11/1986 | Price et al. | |

Primary Examiner—William M. Shoop, Jr.
Assistant Examiner—Marc S. Hoff
Attorney, Agent, or Firm—Stephen G. Rudisill

[57] ABSTRACT

A clock-controlled pulse width modulator comprising an integrator for receiving a variable input voltage and producing an output having a triangular waveform, the integrator including a capacitor which is charged at a rate proportioal to the input voltage and discharged at a rate proportional to the difference between a reference voltage and the input voltage, the charging and discharging occurring during a time interval $T_o$, a clock pulse source for generating a continuous series of clock pulses, a counter receiving the clock pulses and producing a binary control signal which changes state in response to the counting of a preselected number of clock pulses, the control signal having a period $T_o$, and control means for terminating the charging of the capacitor and initiating the discharging of the capacitor in response to the first clock pulse following a selected transition in the control signal, and means for terminating the discharging of the capacitor and initiating the charging of the capacitor in response to the first clock pulse following the discharge of the capacitor to a preselected threshold level.

8 Claims, 2 Drawing Sheets

CLOCK-CONTROLLED PULSE WIDTH MODULATOR

FIELD OF THE INVENTION

The present invention relates to clock-controlled pulse width modulators suitable for use in analog-to-digital converters, particularly converters of the type which use an integrator to produce a triangular waveform, which in turn is used to produce a series of pulses having widths proportional to the magnitude of a variable input voltage.

SUMMARY OF THE INVENTION

It is a primary object of the present invention to provide a clock-controlled pulse width modulator which is capable of producing high-resolution analog-to-digital conversion within a short conversion time. In this connection, a related object is to provide a high-resolution, direct-counting, analog-to-digital converter which is clock-controlled and requires only a single counter.

It is another important object of this invention to provide such a clock-controlled pulse width modulator whose output is, to the first order, substantially independent of circuit component values.

Another object of this invention is to provide such an improved clock-controlled pulse width modulator which has low power consumption and a low parts count.

It is a further object of this invention to provide such an improved clock-controlled pulse width modulator which is readily adaptable to either single or dual power-supply operation, voltage gain and linearization, and/or resistance bridge applications.

Other objects and advantages of the invention will be apparent from the following detailed description and the accompanying drawings.

In accordance with the present invention, the foregoing objectives are realized by providing a clock-controlled pulse width modulator comprising an integrator for receiving a variable input voltage and producing an output having a triangular waveform, the integrator including a capacitor which is charged at a rate proportional to the input voltage and discharged at a rate proportional to the difference between the input voltage and a reference voltage, the charging and discharging occurring during a time interval $T_o$; a clock pulse source for generating a continuous series of clock pulses; counting means receiving the clock pulses and producing a binary control signal which changes state in response to the counting of a preselected number of clock pulses, the control signal have a period $T_o$; and control means for terminating the charging of the capacitor and initiating the discharging of the capacitor in response to the first clock pulse following a selected transition in the control signal, and for terminating the discharging of the capacitor and initiating the charging of the capacitor in response to the first clock pulse following the discharge of the capacitor to a preselected threshold level.

DESCRIPTION OF THE PREFERRED EMBODIMENT

Figure 1:
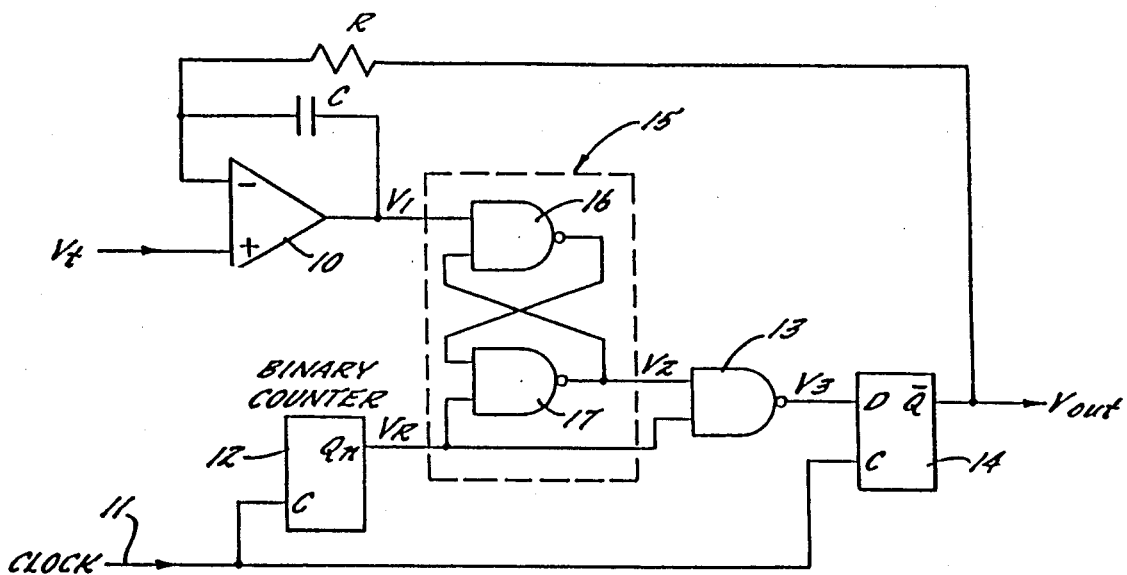
FIG. 1 is a schematic diagram of a clock-controlled pulse width modulator embodying the present invention.

While the invention is susceptible to various modifications and alternative forms, a specific embodiment thereof has been shown by way of example in the drawings and will be described in detail. It should be understood, however, that it is not intended to limit the invention to the particular form disclosed but, on the contrary, the intention is to cover all modifications, equivalents, and alternatives falling within the scope of the invention as defined by the appended claims.

Turning now to the drawings and referring first to FIG. 1, the illustrative system will be described with reference to the waveforms of FIG. 2 as well as the system diagram of FIG. 1; the location of each of the waveforms of FIG. 2 in the system of FIG. 1 is identified by the addition to FIG. 1 of the same reference characters that appear in the left margin of FIG. 2. All the active components in the system of FIG. 1 are powered from a single supply voltage $V_{ref}$ (see FIG. 2) so that the high level of any binary signal is at $V_{ref}$ volts and the low level is at zero volts.

The input signal for the system of FIG. 1 is a variable analog voltage $V_t$ applied to the non-inverting input of an operational amplifier 10. The amplifier 10 cooperates with a resistor R and a capacitor C to form an integrator. The capacitor C is connected between the inverting input of the amplifier 10 and the output of the operational amplifier 10, while the resistor R is connected between the inverting input of the amplifier 10 and the output of the entire system.

The system of FIG. 1 uses the output of the integrator to produce a binary output signal $V_{out}$ comprising a series of pulses whose widths $T_p$ are proportional to the magnitude of the variable input voltage $V_t$. The width and period of these pulses can then be used to produce a digital signal representing the magnitude of the variable input voltage. Indeed, with the illustrative system, the pulse width-to-period ratio of $V_{out}$ is dependent only on the ratio of the input voltage $V_t$ to the known reference voltage $V_{ref}$.

One of the features of the present invention is that the entire system is synchronized with a continuous series of high-frequency clock pulses. Both edges of the variable width pulses in $V_{out}$ are controlled by positive edges of the clock pulses, thereby permitting high-resolution analog-to-digital conversion. Moreover, the high-resolution conversion is achieved with the use of only a single counter, as will be apparent from the ensuring description.

Figure 2:
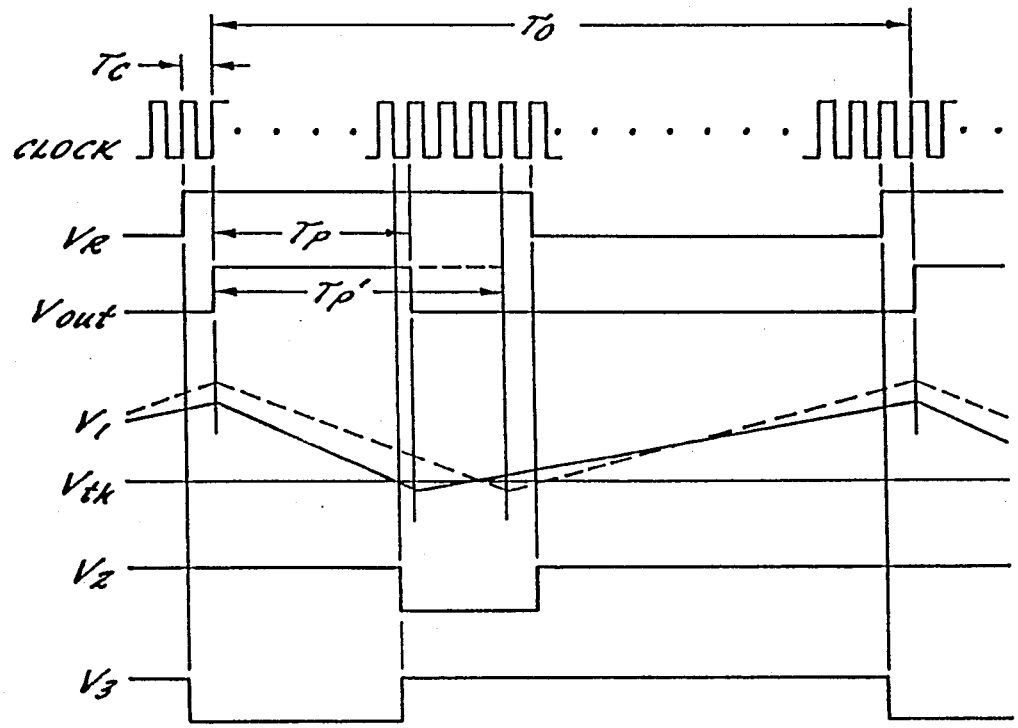
FIG. 2 is a series of waveforms produced at various points in the system of FIG. 1.

During the portion of each cycle of operation of the illustrative system when the binary output signal $V_{out}$ is low, the capacitor C charges at a rate proportional to the magnitude of the variable input voltage $V_t$ (see FIG. 2). Thus, the integrator output voltage $V_1$ ramps up during this portion of each cycle. The charging of the capacitor C and the resultant ramping up of $V_1$ continues as long as the converter output $V_{out}$ remains low.

The time at which $V_{out}$ goes high is determined by the combination of clock pulses from a clock pulse source 11 and a synchronizing square wave $V_R$ from a binary counter 12. The counter 12 receives clock pulses from the source 11 and switches the state of its output $V_R$ each time it has received a preselected number n of clock pulses, thereby producing a square wave $V_R$ with a fixed period $T_o$ equal to the period of 2n clock pulses (see FIG. 2).

Each time the square wave $V_R$ goes high, it causes the output voltage $V_3$ of a NAND gate 13 to go low (see FIG. 2). (The other input to the NAND gate 13 will be discussed below.) The voltage $V_3$ is applied to the D input of a D-type flip flop 14 which receives clock pulses from the source 11 at its clock input. Thus, whenever $V_3$ goes low, the positive edge of the next clock pulse received at the clock input of the flip flop 14 causes the $\overline{Q}$ output $V_{out}$ of the flip flop to go high (see FIG. 2). This $\overline{Q}$ output $V_{out}$ is the binary output of the modulator, and is also the voltage which is applied to the resistor R.

Whenever $V_{out}$ goes high, the charging of the capacitor C terminates, and the capacitor immediately starts to discharge at a rate proportional to the difference between $V_t$ and $V_{ref}$ (see FIG. 2). It will be appreciated that the magnitude of the charge accumulated on the capacitor C when $V_{out}$ goes high, i.e., the maximum magnitude of the integrator output $V_1$ in each cycle of operation, depends on the rate at which the capacitor was charged, which in turn depends on the magnitude of the variable input voltage $V_t$. As will be seen, this maximum charge level determines the pulse width $T_p$ in each operating cycle.

Returning now to the integrator output $V_1$, this voltage is applied to a set-reset flip flop 15 formed by a pair of cross-connected NAND gates 16 and 17. The other input to the set-reset flip flop 15 is the square-wave voltage $V_R$ from the counter 12, which is always high during the discharging of the capacitor C. As long as $V_1$ remains above the threshold level $V_{th}$, i.e., the switching point, of the set-reset flip flop 15, the output $V_2$ of the flip flop 15 remains high. When $V_1$ drops below that threshold, however, the voltage $V_2$ goes low, thereby causing the output $V_3$ of the NAND gate 13 to go high. Consequently, the next clock pulse received by the D flip flop 14 causes the $\overline{Q}$ output to go low, which in turn terminates the discharging, and initiates the charging of the capacitor C. This completes a single cycle of operation.

It will be appreciated that the time required to discharge the capacitor to the threshold level $V_{th}$ depends on the magnitude of the charge on the capacitor C at the time it started to discharge and the rate at which it is discharged. This discharge time, in turn, determines the width $T_p$ of the pulse produced at $V_{out}$. As mentioned previously, the magnitude of the maximum charge level reached by the capacitor C depends on the magnitude of the input voltage $V_t$, and thus the pulse width $T_p$ is during any given cycle of operation of the converter, proportional to the magnitude of the variable input voltage $V_t$ during any given cycle of operation of the converter.

The effect of the magnitude of $V_t$ on the pulse width $T_p$ can be illustrated by a second example represented by the broken-line waveform for $V_1$ in FIG. 2. This broken-line waveform is the result of an input voltage $V_t$ having a magnitude greater than that which produces the solid-line waveform for $V_1$. Because of the increase in $V_t$, the capacitor C charges at a faster rate and thus accumulates a greater charge within the charging portion of the fixed period $T_o$. Consequently, when the capacitor C discharges, which occurs at a slower rate, it takes longer for the capacitor to discharge to the threshold level $V_{th}$. This longer discharge time results in a longer pulse width $T_p$, as clearly illustrated in FIG. 2.

In m periods of the synchronizing square wave $V_R$ the approximately charge balance for the capacitor C is:

$$-\frac{mT_o V_t}{R} + \frac{NT_c V_{ref}}{R} = 0$$

where $T_o$ is the period of the synchronizing waveform $V_R$, $T_c$ is the clock period, and N is the number of clock periods for which $V_{out}$ is high during the time $mT_o$ (maximum error will be $T_c V_{ref}/R$ for $V_t = 0$). It then follows that:

$$\frac{V_t}{V_{ref}} = \frac{NT_c}{mT_o}$$

and if $T_o = nT_c$, then:

$$\frac{V_t}{V_{ref}} = \frac{N}{mn}$$

For a square wave synchronizing waveform, $V_t/V_{ref}$ must be less than ½. The maximum error in N is ±1 count, and thus $V_t/V_{ref}$ can be resolved to within ±1 count in N.

Figure 3:
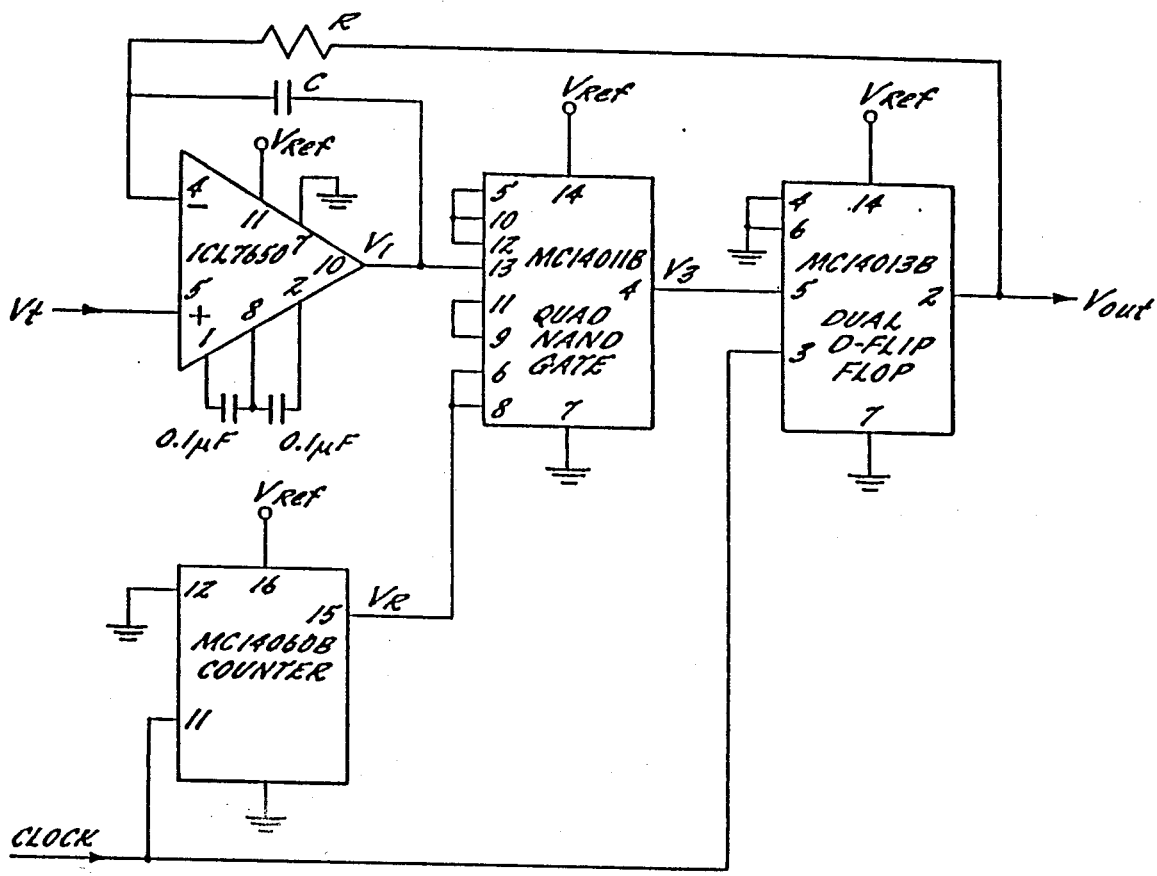
FIG. 3 is a diagram of the system of FIG. 1 as implemented with commercially available components.

A practical implementation of the system of FIG. 1 is shown in FIG. 3, using commercially available chips. The operational amplifier is an ICL7650, the binary counter is an MC14060B, the three NAND gates 13, 16 and 17 are portions of an MC140116 quad nand gate, and the D flip flop 14 is an MC14013B. Because this converter is clock-controlled, it has a high degree of precision and resolution. But because the converter uses only a single counter, it is simple and efficient to fabricate and operate. As can be appreciated from FIGS. 1 and 3, this converter has a low parts count, can be operated from a single-ended power supply, and requires only a small amount of power. Furthermore, the accuracy of the system is, to first order, dependent only on the reference voltage and not on the values of the other components in the system.

Figure 4:
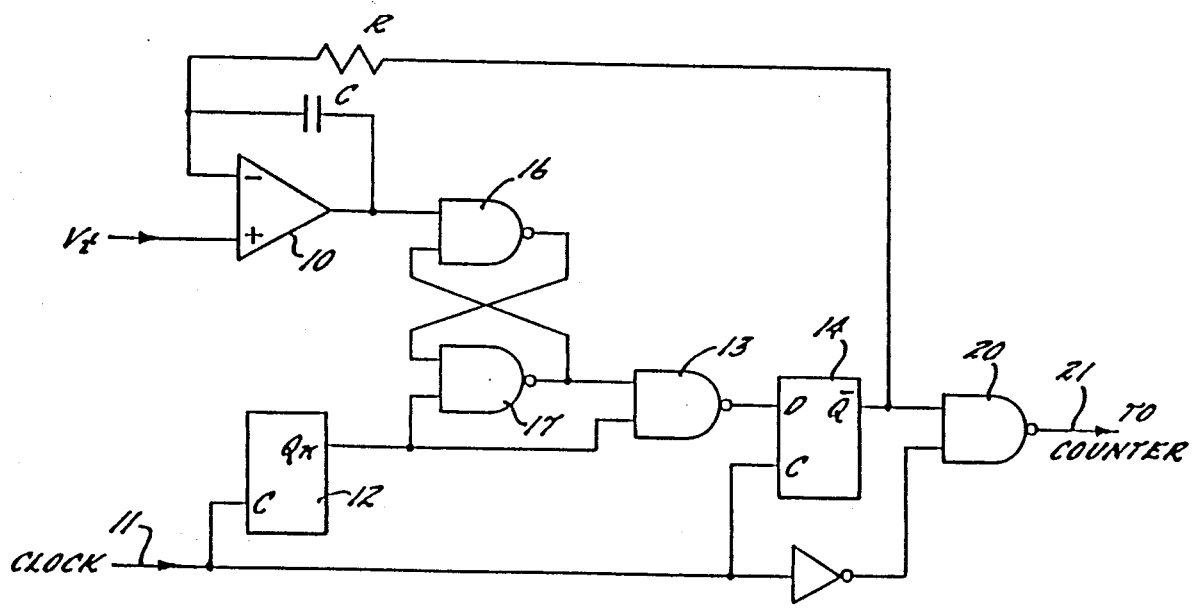
FIG. 4 is a schematic diagram of a direct-counting analog-to-digital converter using the pulse width modulator of FIG. 1.

To produce a digital output representing $V_t/V_{ref}$, the number N of clock periods $T_c$ during which $V_{out}$ is high in a time $mT_o$ can be accumulated in a counter as shown in FIG. 4 (components which are the same in FIGS. 1 and 4 have been identified by the same reference numbers). This is accomplished by supplying the Q output of the D flip flop 14 and inverted clock pulses to a NAND gate 20 leading to a counter input 21. The clock pulses are then passed through the NAND gate 20 only during those intervals when $V_{out}$ is high, so that the number N accumulated in the counter at any given time gives a direct indication of $V_t/V_{ref}$. The counter can be reset at any desired time interval $mT_o$ by simply counting m periods $T_o$ of the waveform $V_R$ and then producing a reset pulse for the counter.

Gain can be provided in the illustrative system by simply connecting a resistor between ground and the inverting input of the operational amplifier 10, although this makes the output dependent on the ratio of the two resistors. Linearization can also be added to the illustrative system by connecting a further resistor between ground and the inverting input of the operational amplifier only when $V_{out}$ is low or only when $V_{out}$ is high. The illustrative system is also particularly well suited for use with resistance bridge transducers, e.g., by connecting such a transducer across the inputs of the operational amplifier 10.

We claim:

1. A clock-controlled pulse width modulator comprising
    an integrator for receiving a variable input voltage $V_t$ and producing an output having a triangular waveform, said integrator including a capacitor which is charged at a rate proportional to the input voltage and discharged at a rate proportional to the difference between a reference voltage $V_{ref}$ and the input voltage, said charging and discharging occurring during a time interval $T_o$,
    a clock pulse source for generating a continuous series of clock pulses having a period $T_c$,
    counting means receiving said clock pulses and producing a binary control signal which changes state in response to the counting of a preselected number of clock pulses, said control signal having a period $T_o$, and
    control means for terminating the charging of said capacitor and initiating the discharging of said capacitor in response to the signal, and means for terminating the discharging of said capacitor and initiating the charging of said capacitor in response to the first clock pulse following the discharge of said capacitor to a preselected threshold level,
    said control means including means for generating an output signal comprising a series of pulses having a pulse width corresponding to the time required, in terms of said clock period $T_c$, for said capacitor to discharge to said preselected threshold level,
    whereby the number of clock periods defining said pulse width of said output signal is maintained directly proportional to the magnitude of said input voltage $V_t$ and whereby the number of clock periods $T_c$ for which said output signal is high within a selected number of control signal periods $T_o$ is proportional to the ratio of the input voltage $V_t$ to the reference voltage $V_{ref}$.

2. A clock controlled pulse width modulator as set forth in claim 1 wherein said binary control signal is a square wave.

3. A clock-controlled pulse width modulator as set forth in claim 1 wherein said control means includes first logic means receiving said control signal and the output of said integrator and producing a binary signal output $V_2$ which changes state in response to a reduction in the output of said integrator below said preselected threshold level, and in response to the first transition in said control signal during the charging of said capacitor.

4. A clock-controlled, pulse width modulator as set forth in claim 3 wherein said control means includes second logic means receiving said control signal and the output signal $V_2$ from said first logic means, and producing a binary output signal $V_3$ which changes state in response to said selected transition in said control signal, and in response to a reduction in the output of said integrator below said preselected threshold level.

5. A clock-controlled pulse width modulator as set forth in claim 4 which wherein said control means includes third logic means receiving said clock pulses and the output signal $V_3$ from said second logic means, and producing a binary output signal $V_{out}$ which changes state in response to the first clock pulse following each transition in the output of said second logic means.

6. A clock-controlled pulse width modulator comprising
    an integrator for receiving a variable input voltage and producing an output having a triangular waveform, said integrator including a capacitor which is charged at a rate proportional to the input voltage and discharged at a rate proportional to the difference between the input voltage and a reference voltage, said charging and discharging occurring during a time interval $T_o$,
    a single clock pulse source for generating a continuous series of clock pulses having a period $T_c$,
    counting means responsive to said clock pulses for terminating the charging of said capacitor and initiating the discharging of said capacitor at fixed time intervals $T_o$,
    logic means responsive to the output of said integrator for terminating the discharging of said capacitor and initiating the charging of said capacitor when said integrator output drops below a preselected threshold level, the discharge period $T_p$ of said capacitor varying in accordance with the magnitude of the charge accumulated by said capacitor in response to said input voltage as well as the discharge rate,
    means for generating an output signal comprising a series of pulses having a pulse width corresponding to the time required, in terms of said clock period $T_c$, for said capacitor to discharge to said preselected threshold level,
    whereby the number of clock periods defining said pulse width of said output signal is maintained directly proportional to the magnitude of said input voltage $V_t$ and whereby the number of clock periods $T_c$ for which said output signal is high within a selected number of control signal periods $T_o$ is proportional to the ratio of the input voltage $V_t$ to the reference voltage $V_{ref}$.

7. A clock-controlled pulse width modulator comprising
    an integrator for receiving a variable input voltage and producing an output having a triangular waveform, said integrator including a capacitor which is charged at a rate proportional to the input voltage and discharged at a rate proportional to the difference between the input voltage and a reference voltage, said charging and discharging occurring during a time interval $T_o$,
    means responsive to the output of said integrator for producing successive output pulses having widths corresponding to the successive discharge times of said capacitor,
    a clock pulse source for generating a continuous series of clock pulses having a period $T_c$,
    means synchronized with said clock pulses for terminating the charging of said capacitor in each operating cycle at a fixed time interval $T_o$ from the termination of the charging of said capacitor in the previous operating cycle,
    means synchronized with said clock pulses for terminating the discharging of said capacitor when the charge on the capacitor drops below a preselected threshold level, and
    means for generating an output signal comprising a series of pulses having a pulse width corresponding to the time required, in terms of said clock period $T_c$, for said capacitor to discharge to said preselected threshold level, whereby the number of clock periods defining said pulse width of said output signal is maintained directly proportional to the magnitude of said input voltage $V_t$ and whereby the number of clock periods $T_c$ for which said output signal is high within a selected number of control signal periods $T_o$ is proportional to the ratio of the input voltage $V_t$ to the reference voltage $V_{ref}$.

8. A clock-controlled pulse width modulator comprising an integrator for receiving a variable input voltage and producing an output having a triangular waveform, said integrator including a capacitor which is charged at a rate proportional to the input voltage and discharged at a rate proportional to the difference between a reference voltage and the input voltage, said charging and discharging occurring during a time interval $T_o$, a clock pulse source for generating a continuous series of clock pulses, counting means receiving said clock pulses and producing a binary control signal which changes state in response to the counting of a preselected number of clock pulses, said control signal having a period $T_o$, and control means for terminating the charging of said capacitor and initiating the discharging of said capacitor in response to the first clock pulse following a selected transition in said control signal, and means for terminating the discharging of said capacitor and initiating the charging of said capacitor in response to the first clock pulse following the discharge of said capacitor to a preselected threshold level said control means including first logic means receiving said control signal and the output of said integrator and producing a binary signal output $V_2$ which changes state in response to a reduction in the output of said integrator below said preselected threshold level, and in response to the first transition in said control signal during the charging of said capacitor, and second logic means receiving said control signal and the output signal $V_2$ from said first logic means, and producing a binary output signal $V_3$ which changes state in response to said selected transition in said control signal, and in response to a reduction in the output of said integrator below said preselected threshold level.

* * * * *